US007346880B2

(12) United States Patent
Huang et al.

(10) Patent No.: US 7,346,880 B2
(45) Date of Patent: Mar. 18, 2008

(54) DIFFERENTIAL CLOCK GANGING

(75) Inventors: Choupin B. Huang, San Jose, CA (US); Charles T. Ballou, Columbia, SC (US); Ramesh K. R. Velugoti, Bangalore (IN); Drin-Guang W. Chen, Irmo, SC (US)

(73) Assignee: Intel Corporation, Santa Clara, CA (US)

( * ) Notice: Subject to any disclaimer, the term of this patent is extended or adjusted under 35 U.S.C. 154(b) by 328 days.

(21) Appl. No.: 11/171,576

(22) Filed: Jun. 30, 2005

(65) Prior Publication Data
US 2007/0006107 A1 Jan. 4, 2007

(51) Int. Cl.
G06F 17/50 (2006.01)
(52) U.S. Cl. .......................................... 716/12; 716/6
(58) Field of Classification Search .................. 716/1, 716/4, 5, 6, 10–15; 326/93–98; 327/141, 327/144, 147
See application file for complete search history.

(56) References Cited

U.S. PATENT DOCUMENTS 6,937,078 B2 * 8/2005 Schrodinger ................ 327/165

7,126,366 B2 * 10/2006 Ohashi et al. .............. 324/765

OTHER PUBLICATIONS

Katrai, Cameron , "Managing Clock Distribution and Optiizing Clock Skew in Networking Applications", *PERICOM; Application Note 14*, (Dec. 29, 1998), pp. 71-78.

* cited by examiner

*Primary Examiner*—Vuthe Siek
(74) *Attorney, Agent, or Firm*—Schubert Osterrieder & Nickelson, PLLC; Jeffrey S. Schubert

(57) ABSTRACT

Methods and arrangements to gang differential clock signals to attenuate pin-to-pin output skew for a clock driver are disclosed. Embodiments may comprise a pattern of conductors to interconnect output pins for differential clock signals with termination resistors. The pattern of conductors comprises a group of conductors for a positive clock (p-clock) signal and a group of conductors for a negative clock (n-clock) signal. The conductors for the p-clock signal intersect at a gang point between the output pins and pads for the termination resistors. Similarly, the conductors for the n-clock signals intersect at a gang point between the pins and the pads. In many embodiments, the distance between the pins and pads may be approximately 120 mils. In further embodiments, the distance may be longer or shorter than 120 mils. Other embodiments are disclosed and claimed.

28 Claims, 7 Drawing Sheets

US 7,346,880 B2

DIFFERENTIAL CLOCK GANGING

FIELD

The present invention is in the field of differential clock distribution. More particularly, the present invention relates to methods and arrangements to gang differential clock signals to attenuate pin-to-pin output skew for a clock driver.

BACKGROUND

Differential clock distribution has long played a critical role in, e.g., INTEL's IA32 and Itanium systems based on the parallel front side bus (FSB) and more recently in high-speed differential (HSD) serial links, such as common system interface (CSI), fully buffered dual in-line memory module (FBD), and PCI-Express. As a hybrid of common-clock and source-synchronous signaling, the FSB has always depended on tightly controlled clock skew characteristics for discrete clock components. Clock skew refers to a propagation delay difference between receipts of clock transitions at different locations within a system. Clock skew forces the design of faster and more complex components downstream to compensate for the propagation delay.

With FSB speeds increasing towards, e.g., 1600 million transfers per second (MT/s) for the next generation of digital enterprise systems, clock skew is a more significant portion of the total cycle time. Thus, the static clock skew should be minimized. Static clock skew is the sum of the pin-to-pin output skew, interconnect skew, and input capacitance delta induced skew.

One of the key specifications for FSB differential clocking is pin-to-pin output skew, which is controlled for as many as five agents in a multiprocessor design. Current solutions can do very little to improve the static clock skew performance of discrete clock drivers, the best of which now guarantee about plus or minus 50 picoseconds (ps) for pin-to-pin output skew. For example, current solutions involve selecting lengths for the metal lines between the clock driver outputs and the differential clock loads to minimize clock skew via propagation delay times.

BRIEF DESCRIPTION OF THE DRAWINGS

Advantages of the invention will become apparent upon reading the following detailed description and upon reference to the accompanying drawings in which like references may indicate similar elements.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, methods and arrangements to gang differential clock signals to attenuate pin-to-pin output skew for a clock driver are contemplated. Embodiments may comprise a pattern of conductors to interconnect output pins for differential clock signals with termination resistors. The pattern of conductors comprises a group of conductors for a positive clock (p-clock) signal and a group of conductors for a negative clock (n-clock) signal. The conductors for the p-clock signal intersect at a gang point between the output pins and pads, which may be for the termination resistors. Similarly, the conductors for the n-clock signals intersect at a gang point between the pins and the pads. In many embodiments, the distance between the pins and pads may be approximately 120 mils (0.120 inches). In further embodiments, the distance may be longer or shorter than 120 mils.

In some embodiments, the conductors are metal lines printed or otherwise formed on a circuit board. The circuit board may be a motherboard, daughter board, or another board upon which to mount a clock driver chip.

In several embodiments, the pattern of conductors for the p-clock signals and the n-clock signals are the same although offset from one another to avoid electrical interconnections between the n-clock conductors with the p-clock conductors. For instance, some embodiments offset the p-clock conductors and the n-clock conductors by a non-conductive layer. Further, the patterns of conductors for the p-clock and n-clock signals may be symmetrical about the gang point between the pins and pads.

While portions of the following detailed discussion describes embodiments of the invention with reference to a front-side bus, persons of ordinary skill in the art will recognize that embodiments may implemented in conjunction with any two or more differential clock signals having the same frequency such as common system interface (CSI), fully-buffered DIMM (FBD), peripheral component interconnect express (PCI-X), and other high speed differential (HSD) serial links.

Figure 1:
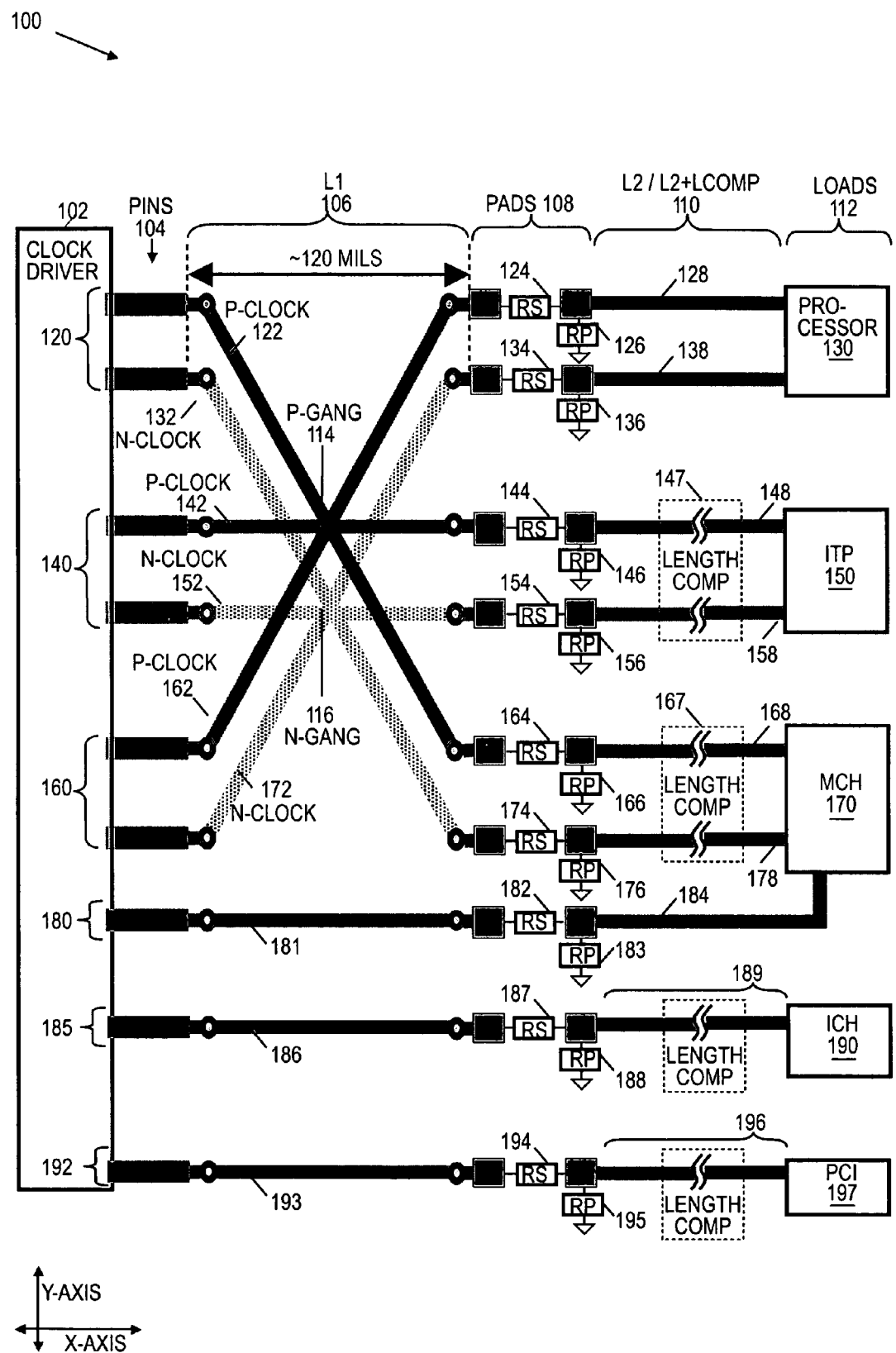
FIG. 1 depicts an embodiment of a system including a clock driver with differential clock ganging interconnections for a processor and a chipset.

Turning now to the drawings, FIG. 1 illustrates an embodiment of a system 100 including a clock driver 102 with differential clock ganging interconnections, 122, 132, 142, 152, 162, and 172, for clock loads 112 such as a processor 130, MCH 170, and ITP 150. The present embodiment comprises three differential clock signals but other embodiments may comprise two or more differential clock signals. For instance, in multiple processor embodiments, a separate pair of differential clock signals may be dedicated for each processor. All of the differential clock signals may be ganged at a single p-clock gang point and a single n-clock gang point, advantageously averaging the clock skew at the output of clock driver 102, which significantly attenuates pin-to-pin output skew. In some embodiments, in fact, the pin-to-pin output skew is eliminated. In other embodiments, the differential clock signals may be ganged at one or more p-clock gang points and n-clock gang points.

System 100 resides on a printed circuit board and comprises clock driver 102 with three differential clock signal outputs 120, 140, and 160, and three single ended clock signal outputs 180, 185, and 192. Clock driver 102 may be a clock synthesizer chip such as a CK410B clock chip for INTEL's 855GME or E7205 chipsets. Clock driver 102 is mounted on the printed circuit board as is processor 130, in target probe (ITP) 150, memory controller hub (MCH) 170, input-output controller hub (ICH) 190, and peripheral component interconnect (PCI) 197. Clock driver 102 coordinates communications amongst these chips via the differential and single ended clock signals through interconnections on the printed circuit board. In particular, clock driver 102 drives the clock signals through conductors, L1 106, to termination resistor pads 108 and from the pads 108 to loads 112 via conductors, L2/L2+comp 110.

Clock driver 102 produces the differential and single ended clock signals to synchronize transmissions across a bus such as a front-side bus (FSB), a back-side bus, a universal serial bus (USB), a peripheral interconnect component (PCI) bus, and the like. Differential clock signals 120, 140, and 160 comprise a positive clock (p-clock) signal and a negative clock (n-clock) signal. In particular, clock driver 102 provides a High Speed current mode, current steering output, which develops a clock signal at pins 104 by alternatively steering programmable constant currents to external shunt termination resistors such as shunt termination resistors 126 and 136 for differential clock signal 120, shunt termination resistors 146 and 156 for differential clock signal 140, and shunt termination resistors 166 and 176 for differential clock signal 160.

The p-clock signals couple with conductors 122, 142, and 162 via pins 104. Pins 104 are the output pins from the chip package of clock driver 102. The p-clock conductors 122, 142, and 162 may be metal conductors printed on the printed circuit board to interconnect the p-clock signals with corresponding termination resistor pads 108.

The p-clock conductors 122, 142, and 162 intersect at a mid-point between pins 104 and pads 108, which is referred to as a p-gang point 114. P-gang point 114 can be anywhere between the p-clock pin for differential clock signal 120 and the p-clock pin for differential clock signal 160. Thus, conductors for p-clock signals 122, 142, and 162 form a pattern of conductors that is symmetrical about the x-axis and y-axis of a plane defined by the circuit board or, more specifically, the metallization layer of the circuit board upon which the p-clock conductors 122, 142, and 162 reside.

Similarly, the n-clock signals couple with conductors 132, 152, and 172, forming a pattern substantially equivalent to the pattern formed by the p-clock conductors 122, 142, and 162. The intersection point for the n-clock conductors 132, 152, and 172 is referred to as an n-gang point 116. N-gang point 116 can be anywhere between pins 104 and pads 108 and midway between the n-clock pin for differential clock signal 120 and the n-clock pin for differential clock signal 160. However, to avoid an electrical interconnection between the p-clock signals and the n-clock signals, n-clock conductors 132, 152, and 172 reside on a different metallization layer than p-clock conductors 122, 142, and 162. In other embodiments, the patterns of conductors for the n-clock signals and the p-clock signals may not be the same and/or may not be symmetrical about the x-axis and/or y-axis.

Note also that the distance between pins 104 and pads 108 is approximately 120 mils in the present embodiment. The distance between pins 104 and pads 108 is preferably small and, in further embodiments, the distance may be more or less than 120 mils. For instance, in one embodiment, the distance between pins 104 and pads 108 is approximately 60 mils.

Driving the p-clock signals and n-clock signals through p-gang point 114 and n-gang point 116 effectively averages the clock skew associated with differential clock signals 120, 140, and 160. With a skew budget such as 100 picoseconds (ps) for the pin-to-pin output of clock driver 102 and 70 ps or less for the interconnection between clock driver 102 and loads 112, ganging the p-clock signals and the n-clock signals can advantageously increase the clock skew budget for the interconnection between clock driver 102 and loads 112 by 70 ps to 170 ps, significantly reducing the design constraints for the interconnection. Furthermore, reducing the pin-to-pin output clock skew can advantageously decrease the overall clock skew between clock driver 102 and loads 112 and, thus, significantly reduce the complexity of circuits in loads 112 needed to compensate for clock skew.

In the present embodiment, differential clock signals 120, 140, and 160 are terminated at pads 108 with series isolation resistors as well as shunt termination resistors. For example, the averaged p-clock signal from p-gang point 114 is driven through series isolation resistor 124 and shunt termination resistor 126 at pads 108. The series isolation resistor 124 provides extra isolation of the on-die and on-package parasitic capacitance of clock driver 102 from the line 128, which interconnects processor 130 with pads 108. This extra isolation provided by series isolation resistor 124 forces reflected signals to terminate more properly through shunt termination resistor 126. A trade-off for series isolation resistor 124 may be a reduced voltage swing for the averaged p-clock signal from p-gang point 114.

The shunt termination resistor 126 shunts the averaged p-clock signal to a low circuit voltage such as ground. The averaged n-clock signal from n-gang point 116 is similarly terminated with an isolation resistor 134 and shunt termination resistor 136. Shunt termination resistors such as 126 and 132 perform a dual function. Shunt termination resistors convert the current output of clock driver 102 into voltages and can match the output impedance of clock driver 102 with the impedance of transmission lines such as transmission lines 128 and 138.

In other embodiments, different arrangements for termination resistors may be implemented. For example, in one embodiment, a shunt termination transistor may be implemented without a series isolation resistor.

The averaged p-clock signal and n-clock signal is driven through p-gang point 114 and n-gang point 116, respectively, to shunt termination resistors 146, 156, 166, and 176 and series isolation resistors 144, 154, 164, and 174 at pads 108 in a manner similar to that described for processor 130 to provide extra isolation of the on-die and on-package capacitance from the lines 138, 148, 158, 168, and 178, which interconnect ITP 150 and MCH 170 with pads 108. Lines 128, 138, 148, 158, 168, and 178 may comprise conductors such as metal lines printed on to the circuit board.

Lines 148, 158, 168, and 178 may further comprise length compensation 147 and 167 to compensate for differences in clock skew at ITP 150 and MCH 170, respectively. In particular, the input capacitance of processor 130, ITP 150, and MCH 170 affect the clock skew associated with differential clock signals 120, 140, and 160, respectively. To compensate for these differences in clock skew, length compensation 147 represents a difference in the length of lines 148 and 158 with respect to lines 128 and 138 to adjust the propagation time for the averaged differential clock signal between pads 108 and ITP 150. Similarly, length compensation 167 represents a difference in the length of lines 168 and 178 with respect to lines 128 and 138 to adjust the propagation time for the averaged differential clock signal between pads 108 and MCH 170.

Processor 130 may be a processor such as INTEL's PENTIUM XEON processors, PENTIUM 4 processors, PENTIUM D processors, or other processors that utilize differential clock signals to communicate via a parallel bus or high-speed differential serial link.

ITP 150 is a key tool to debug a basic input-output system (BIOS), logic, signal integrity, general software, and general hardware issues involving processors, chipsets, serial input-output (SIO) ports, PCI devices, and other hardware in a platform design. ITPs such as ITP 150 may also be used to validate, test, and debug third-party BIOS and other developer products.

MCH 170 may be a memory controller hub such as INTEL's 855GME graphics and memory controller hub (GMCH), 82955X MCH, or the like. MCH 170 may be a host bridge that contains a processor interface, a memory controller, and an integrated graphics device. MCH 170 may also contain a PCI-X port as an external graphics interface. In the present embodiment, MCH 170 receives a single ended clock signal 180 in addition to the differential clock signal to coordinate transactions across, e.g., a backside bus between MCH 170 and ICH 190. While not shown in this illustration, embodiments may also include a separate, single ended clock signal to coordinate communications for a graphics port coupled with MCH 170.

Clock driver 102 may output single ended clock signals 180, 185, and 192 to MCH 170, ICH 190, and PCI 197. Single ended clock signals 180, 185, and 192 couple with series isolation resistors 182, 187, and 194, respectively, via pins 104 and transmission lines 181, 186, and 193. Series isolation resistors 182, 187, and 194 provide extra isolation of the on-die and on-package parasitic capacitance of clock driver 102 from the lines 184, 189, and 196, which interconnect MCH 170, ICH 190, and PCI 197, respectively, with pads 108. The extra isolation provided by series isolation resistors 182, 187, and 194 may force reflected signals to terminate more properly through shunt termination resistors 183, 188, and 195, respectively.

Transmission lines 189 and 196 comprise length compensation to compensate for differences in clock skew at MCH 170, ICH 190, and PCI 197. The extra lengths provided by the length compensations effectively add time delays to the clock signals 185 and 192 with respect to the inherent time delay associated with propagation across the length of line 184.

ICH 190 may be an input-output controller hub such as INTEL's 82801 DB ICH4 or other based upon the selection of processor 130. ICH 170 may comprise transaction ordering queues, an interrupt controller, and a real-time clock to coordinate upstream and downstream transactions between processor 130, MCH 170, and input-output (I/O) busses such PCI/PCI-X, a universal serial bus (USB), an AT attachment (ATA), and/or other legacy busses. Single ended clock signal 185 may coordinate transactions across a back-side bus between MCH 170 and ICH 190.

PCI 197 may comprise slots for hot-swappable PCI controller cards, each supporting, e.g., up to six PCI devices. Single ended clock signal 192 may coordinate upstream and downstream transactions between PCI 197 and ICH 190. In further embodiments, additional and/or different components may receive single ended and/or differential clock signals driven by clock driver 102.

Figure 2:
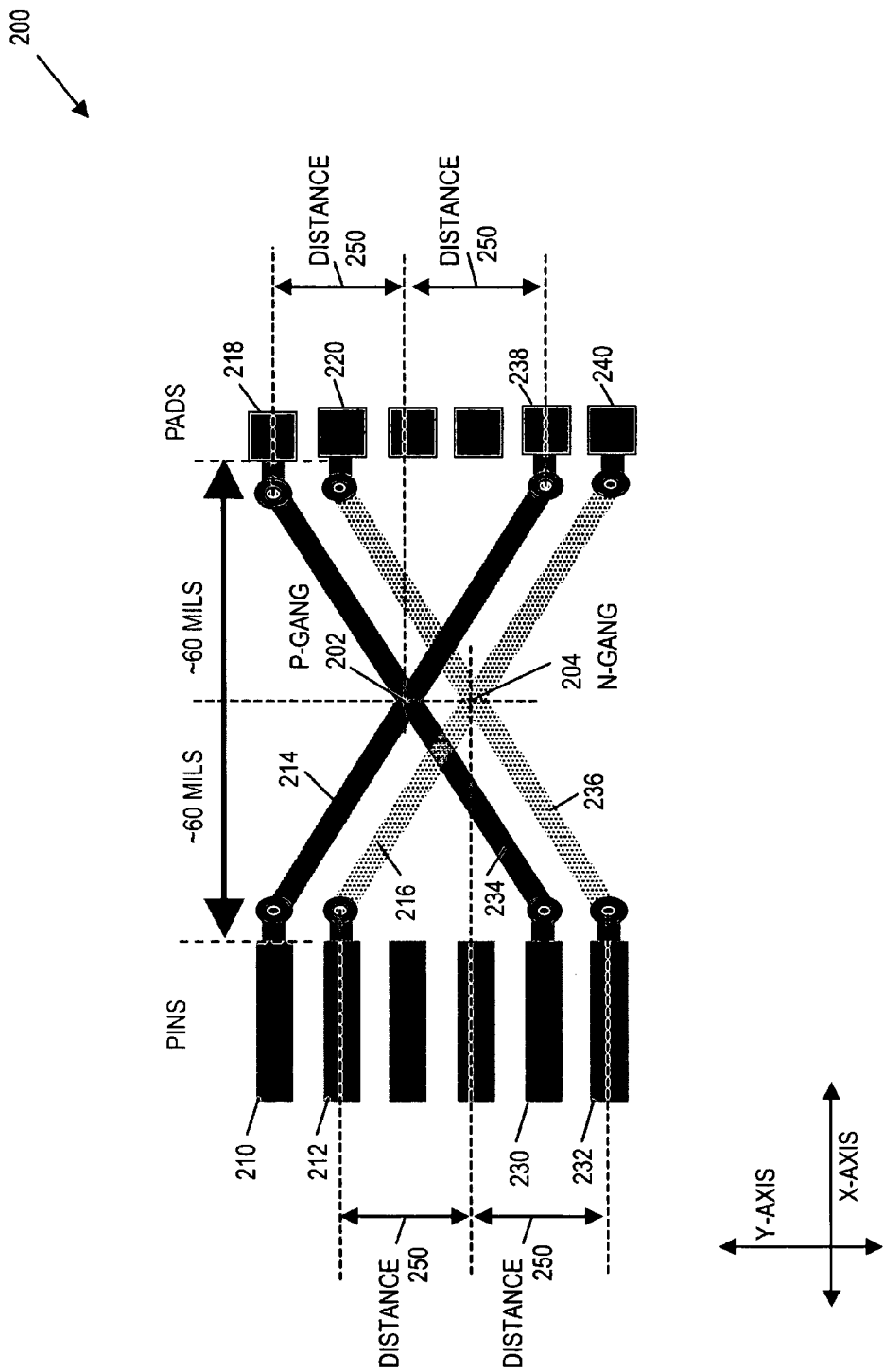
FIG. 2 depicts an embodiment of two differential clock signals symmetrically-ganged via conductive layers of a circuit board.

FIG. 2 illustrates an embodiment of two differential clock signals symmetrically-ganged via conductive layers of a circuit board. More specifically, pins 210 and 212 are output pins of a clock driver for a first differential clock signal and pins 230 and 232 are output pins from the clock driver for a second differential clock signal. Each differential clock signal comprises a p-clock signal and an n-clock signal.

Output pins 210 and 230 represent the p-clock pins, which interconnect with conductors 214 and 234, respectively, and conductors 214 and 234 conductively intersect at p-gang point 202. P-gang point 202 is approximately a distance 250 below pin 210 and pad 218 along the y-axis, a distance 250 above pin 230 and pad 238 along the y-axis, and midway (approximately 60 mils) between the pins 210 and 230 and pads 218 and 238. Distance 250 may vary depending upon the clock driver package. Notice that the lengths of conductors 214 and 234 between p-gang point 202 and pads 218 and 238 are equal regardless of distance 250 and, thus, the pattern formed by conductors 214 and 234 after p-gang point 202 is symmetrical.

Similarly, output pins 212 and 232 represent the n-clock pins, which interconnect with conductors 216 and 236. Conductors 216 and 236 conductively connect at n-gang point 204 but reside on a different conductive layer than p-gang point 202 so the p-clock signals and n-clock signals are electrically separate. N-gang point 204 is approximately a distance 250 below pin 212 and pad 220 along the y-axis, a distance 250 above pin 232 and pad 240 along the y-axis, and midway between the pins 212 and 232 and pads 220 and 240. Thus, the pattern of conductors 214 and 234 for p-clock signals is substantially equivalent to the pattern of conductors 216 and 236 for n-clock signals.

In other embodiments, the patterns of conductors may vary to provide substantially symmetrical gang points for four or more differential clock signals. Furthermore, the pattern of conductors for the p-clock signals and the n-clock signals may be asymmetrical. However, patterns that provide substantially the same amount of clock skew between the gang points 202 and 204 and the pads such a 218 and 220 may provide more clearly defined clock transitions.

Figure 3:
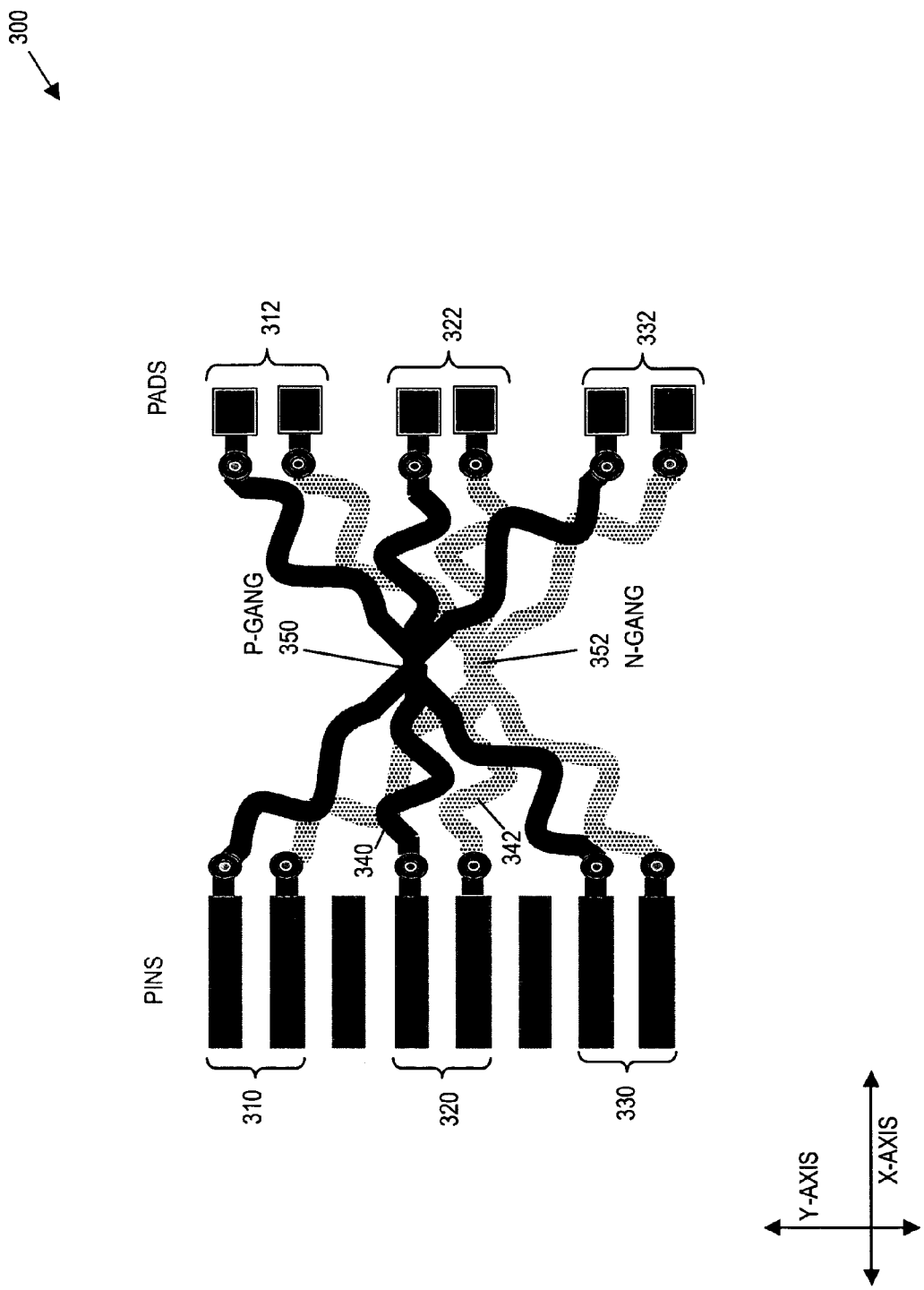
FIG. 3 depicts another embodiment of three differential clock signals symmetrically-ganged via conductive layers of a circuit board.

FIG. 3 depicts another embodiment of three differential clock signals symmetrically-ganged via metal layers of a circuit board. In this embodiment, the printing technique for forming metal conductors on the circuit board has inaccuracies, which result in less than straight conductors between the pins 310, 320, and 330 and pads 312, 322, and 332. However, ganging the p-clock signals such as p-clock signal 340 at p-gang point 350 and the n-clock signals such as n-clock signal 342 at n-gang point 352 may still effectively average the pin-to-pin output skew of the differential clock signals.

Figure 4:
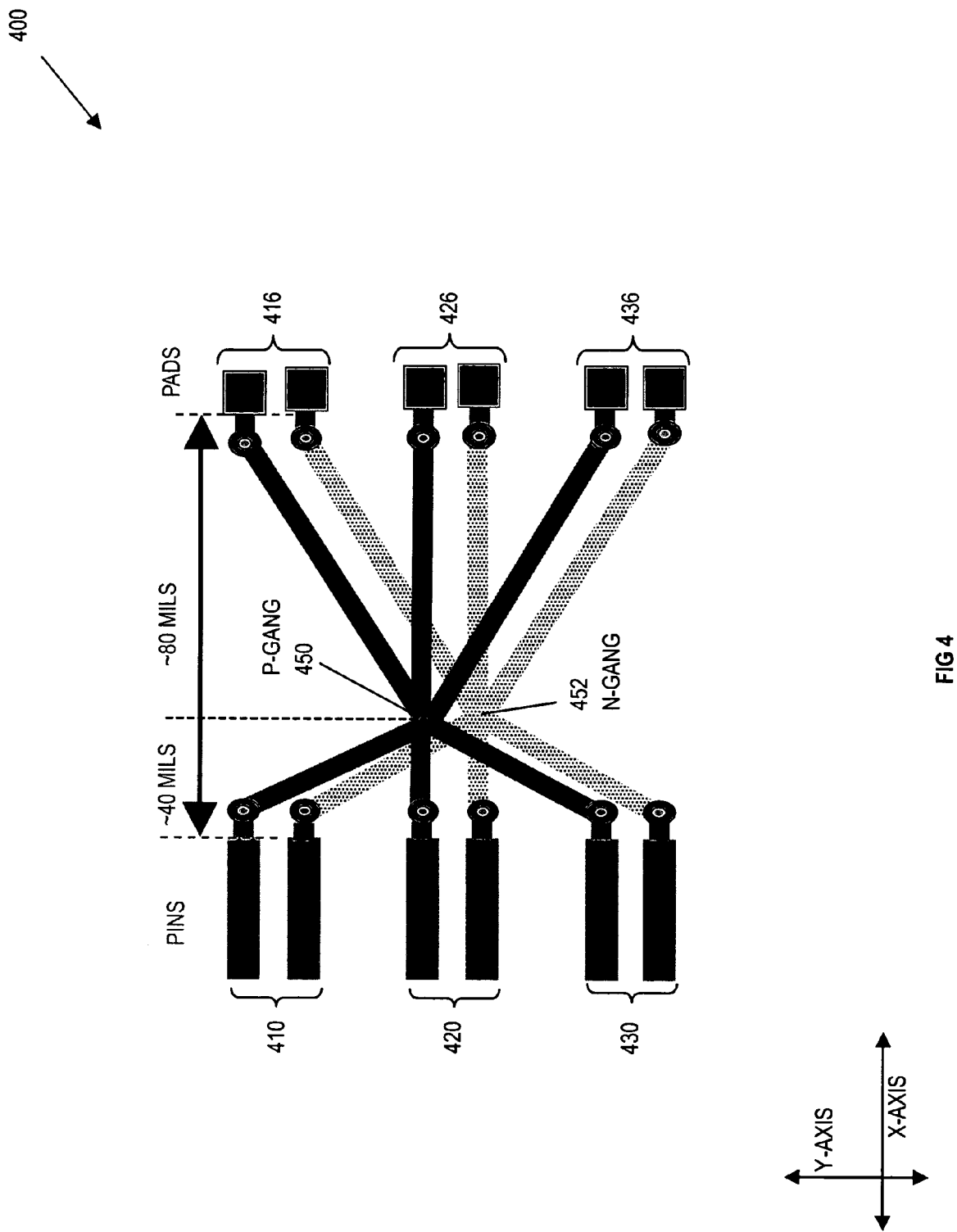
FIG. 4 depicts an embodiment of three differential clock signals asymmetrically-ganged via conductive layers of a circuit board.

FIG. 4 depicts an embodiment of three differential clock signals asymmetrically-ganged via metal layers of a circuit board. In particular, differential clock signals 410, 420, and 430 gang at p-gang point 450 and n-gang point 452, which is approximately 40 mils, or one-third of the distance between the pins 410, 420, and 430 and pads 416, 426, and 436. In this embodiment, the asymmetrical pattern may provide less than ideal averaging for the clock skew of differential clock signals 410, 420, and 430 and, as a result, pin-to-pin clock skew may be larger than can be realized by a more symmetric pattern of metal lines. Note that the conductors connected between p-gang 450, n-gang 452, and pads 426 are shorter than the conductors connected between p-gang 450, n-gang 452, and pads 416 and 436 so the patterns formed by these conductors are asymmetrical. In further embodiments, the gang points, p-gang point 450 and/or n-gang point 452 may be asymmetrically positioned with respect to the y-axis.

Figure 5:
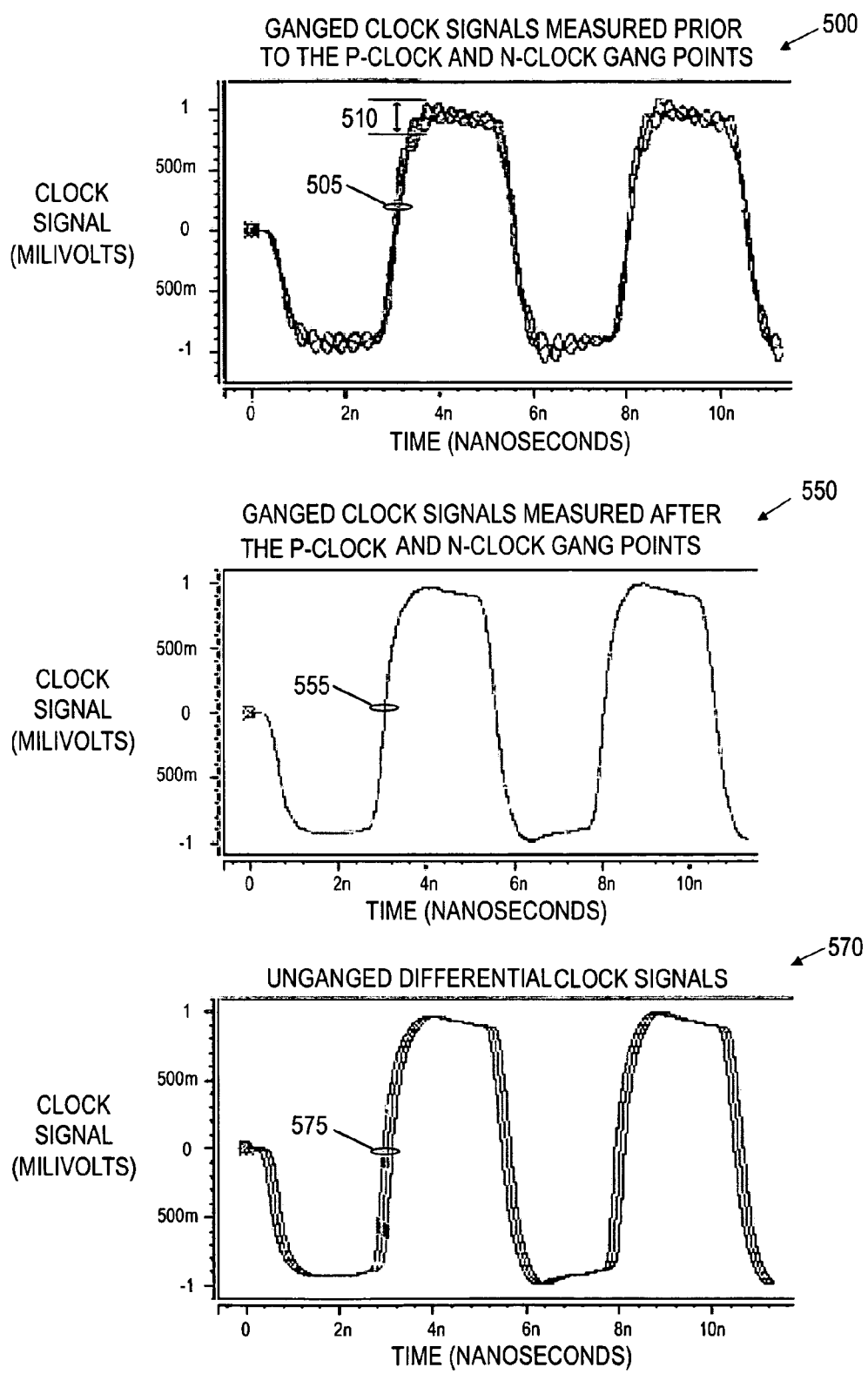
FIG. 5 depicts two graphs of differential clock signals for an embodiment such as the three ganged differential clock signals of FIG. 1 and one graph of the same differential clock signals in which the signals are not ganged.

FIG. 5 depicts two graphs of ganged differential clock signals such as the three ganged differential clock signals of FIG. 1 and one graph in which the differential signals are not ganged. Graph 500 illustrates ripples 510 in differential clock signals at a point prior to the p-clock and n-clock gang points. The waveforms 505 represent the skewed clock signals at the pins of a clock driver and the ripples 510 may be caused by reflections of the phase differences off the gang points.

Graph 550 illustrates averaged waveforms 505 after the gang points. In particular, graph 550 depicts the resulting differential clock signals 555 at the termination resistor pads. Note that the differential clock signals 555 overlap to a substantial degree so appear to be a single clock signal. Thus, the pin-to-pin clock skew is substantially attenuated in differential clock signals 555 as a result of ganging.

Graph 570 illustrates the same differential clock signals but the three differential clock signals 575 are not ganged. In particular, notice the time delays between the rising edges of the signals 575. These time delays, in addition to other potential static clock skews must be accounted for by downstream logic to coordinate transactions across the corresponding differential bus or high speed serial link.

Figure 6:
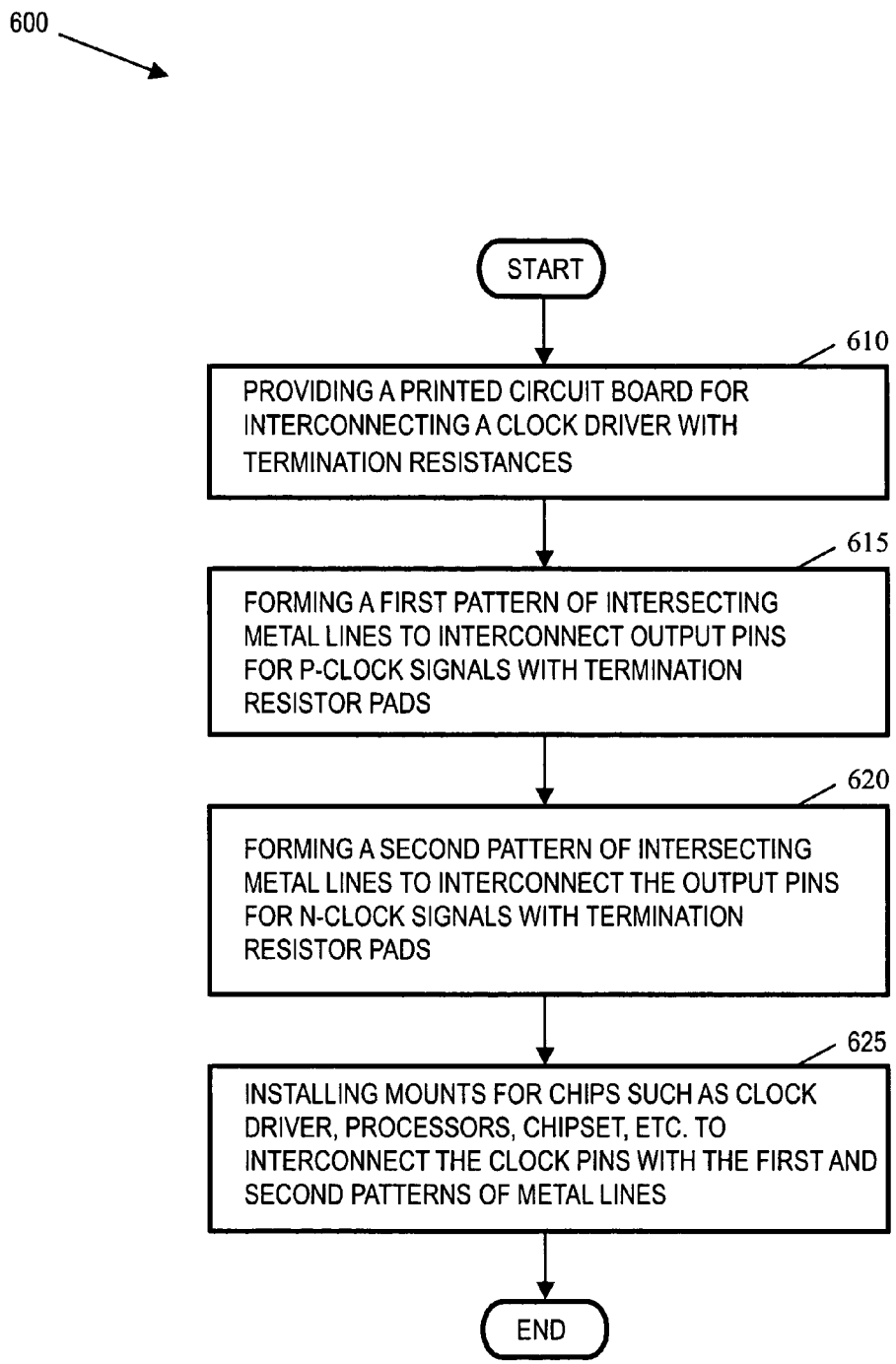
FIG. 6 depicts a flowchart of an embodiment to gang differential clock pairs via production of a circuit board.

FIG. 6 depicts a flowchart 600 of an embodiment to gang differential clock pairs via circuit board. In particular, flowchart 600 describes preparation of ganged interconnections for clock driver pins on a motherboard to interconnect the output pins with termination resistor pads for differential clock signals. Flowchart 600 begins with providing a printed circuit board for interconnecting a clock driver with termination resistances (element 610). The circuit board may have other patterns printed or formed on the surface such as metallic rings for pin connections for the clock driver and other chips.

Focusing on preparation for the differential clock signals, a first pattern of intersecting metal lines is formed to interconnect output pins for p-clock signals with termination resistances on a first metallization layer (element 615). In other embodiments, the n-clock interconnections may be formed prior to forming the p-clock interconnections. For example, the n-clock interconnections may be formed on one metallization layer, a non-conductive layer may be formed over the n-clock interconnections, and then the p-clock interconnections may be formed in a subsequent metallization layer. Between forming metallization layers, the non-conduct layers may be etched to form interconnections between the multiple metallization layers.

In the present embodiment, a second pattern of intersecting metal lines is formed to interconnect the output pins for n-clock signals with termination resistance pads (element 620). The metallization layers may be formed by, e.g., printing the metal patterns on the circuit board, or by a more accurate method.

After the patterns of interconnections are formed on the circuit board, mounts for chips such as clock driver, processors, chipset, etc. may be installed to interconnect the clock pins with the first and second patterns of metal lines (element 625). In some embodiments, the mounts are installed prior to installation of, e.g., termination resistors and/or isolation resistors.

Figure 7:
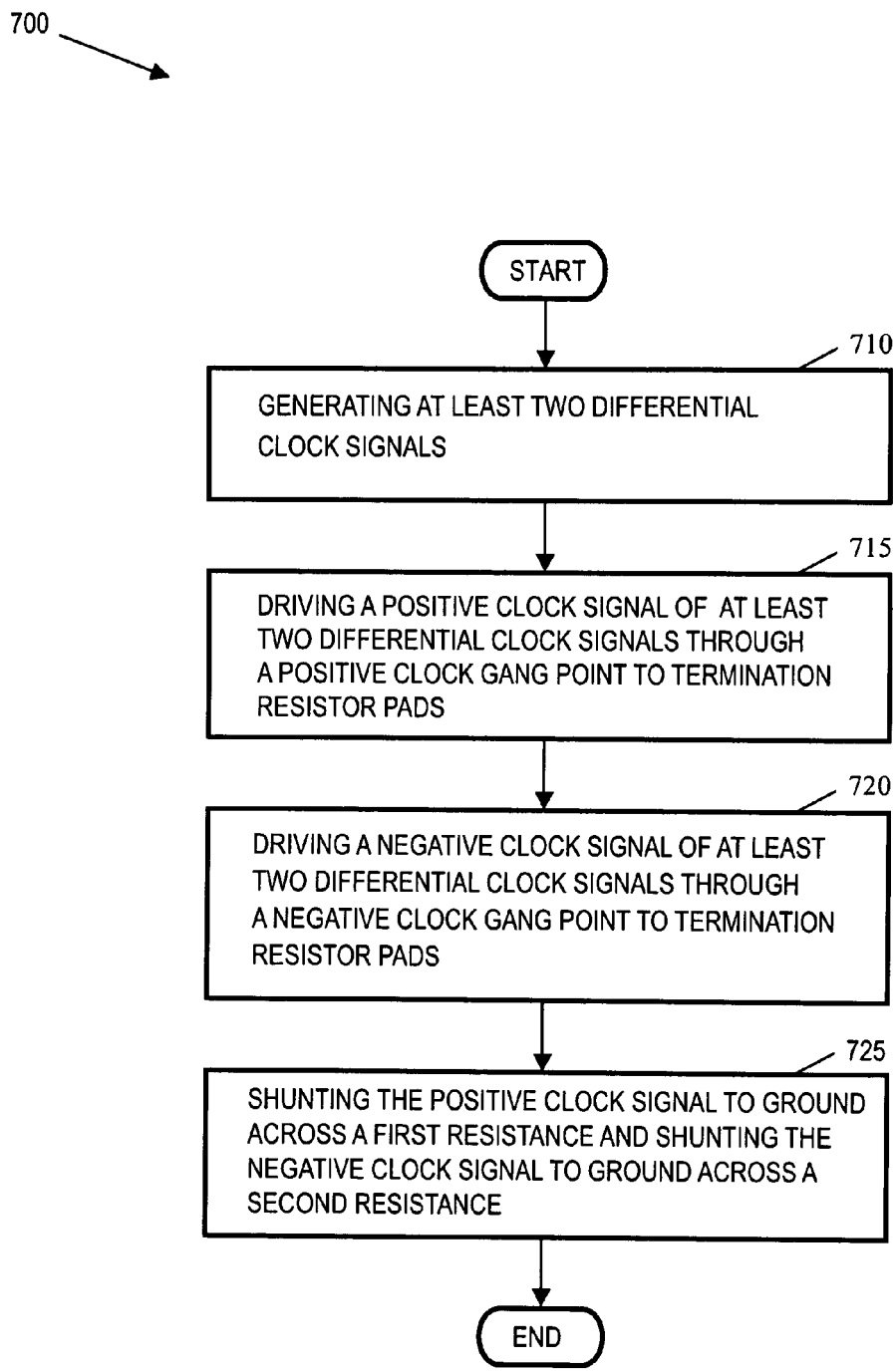
FIG. 7 depicts a flowchart of an embodiment to drive a differential clock load.

Turning now to FIG. 7, a flowchart 700 of an embodiment provides an illustration of driving a differential clock load. Flowchart 700 begins with generating at least two differential clock signals (element 710). For example, a clock driver may generate a current and steer the current between a positive clock output and a negative clock output to generate each of the differential clock signals.

The clock driver may then drive the currents from the positive output pins for the differential clock signals via a first pattern of conductors through a positive clock gang point to termination resistor pads (element 715). In particular, the first pattern of conductors may be electrically or otherwise conductively connected at the positive clock gang point to effectively average the skew between the positive clock signals.

The clock driver may also drive the currents from the negative output pins for the differential clock signals via a second pattern of conductors through a negative clock gang point to the resistor termination pads (element 720). Because the second pattern of conductors may be electrically or otherwise conductively connected at the negative clock gang point, the skew of the negative clock signals are also effectively averaged.

Once the averaged positive clock signals and negative clock signals reach a pair of termination pads, the signals are separately shunted to ground to convert the current-based differential clock signal to a voltage-based differential clock signal (element 725). The voltage-based differential clock signal may then be applied to a clock load to synchronize transactions across a bus such as a parallel bus or a high-speed differential link.

Another embodiment of the invention is implemented as a program product for use with a system to perform processes such as the processes described in conjunction with flowcharts 600 and 700 as illustrated in FIGS. 6 and 7. The program(s) of the program product defines functions of the embodiments (including the methods described herein) and can be contained on a variety of data and/or signal-bearing media. Illustrative data and/or signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet and other networks. Such data and/or signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by a computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

It will be apparent to those skilled in the art having the benefit of this disclosure that the present invention contemplates systems and arrangements to gang differential clock signals to attenuate pin-to-pin output skew for a clock driver. It is understood that the form of the invention shown and described in the detailed description and the drawings are to be taken merely as examples. It is intended that the following claims be interpreted broadly to embrace all the variations of the embodiments disclosed.

Although the present invention and some of its advantages have been described in detail for some embodiments, it should be understood that various changes, substitutions and alterations can be made herein without departing from the spirit and scope of the invention as defined by the appended claims. Although an embodiment of the invention may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
    directing more than one positive clock signals of more than one differential clock signals from a clock driver via a first pattern of conductors through a positive clock gang point, the first pattern being conductively interconnected at the positive clock gang point; and
    directing more than one negative clock signals of the more than one differential clock signals from the clock driver via a second pattern of conductors through a negative clock gang point, the second pattern being conductively interconnected at the negative clock gang point, to drive loads with the more than one differential clock signals, wherein directing the more than one positive clock signals through a positive gang point comprises directing the more than one positive clock signals through a positive gang point through a different metal layer than the metal layer of the negative clock gang point.

2. The method of claim 1, further comprising generating the more than one differential clock signals with the clock driver, wherein each differential clock signal comprises a positive clock signal of the more than one positive clock signals and a negative clock signal of the more than one negative clock signals.

3. The method of claim 1, wherein directing the more than one positive clock signals comprises forming a first pattern of conductors to couple more than one positive clock pins for the differential clock signals produced by the clock driver with termination resistor pads, the first pattern electrically interconnecting the more than one positive clock pins at the positive clock gang point.

4. The method of claim 3, wherein forming the first pattern comprises forming the first pattern to be substantially symmetrical about an axis in a plane of the first pattern.

5. The method of claim 3, wherein forming the first pattern comprises printing metal lines on a first metal layer in the first pattern, wherein the first pattern is asymmetrical about an axis in a plane of the first metal layer.

6. The method of claim 3, wherein directing the more than one negative clock signals comprises forming a second pattern of conductors that is substantially similar to the first pattern.

7. The method of claim 1, wherein directing the more than one negative clock signals comprises forming a second pattern of conductors to couple more than one negative clock pins for the differential clock signals produced by the clock driver with termination resistor pads, the second pattern electrically interconnecting the more than one negative clock pins at the negative clock gang point.

8. The method of claim 7, wherein forming the second pattern comprises printing metal lines on a second metal layer in the second pattern.

9. The method of claim 7, wherein forming the second pattern comprises printing metal lines in the second pattern, wherein the second pattern is asymmetrical about an axis in a plane of the second pattern.

10. A circuit board comprising:
    a first pattern of conductors to drive more than one positive clock signals of more than one differential clock signals from a clock driver through a positive clock gang point, the first pattern being conductively interconnected at the positive clock gang point; and
    a second pattern of conductors to drive more than one negative clock signals of the more than one differential clock signals from the clock driver through a negative clock gang point, the second pattern being conductively interconnected at the negative clock gang point, to drive loads with the more than one differential clock signals, wherein the positive gang point and the negative gang point reside on different layers of the circuit board.

11. The circuit board of claim 10, wherein the first pattern of conductors is to couple the more than one positive clock signals of the differential clock signals with termination resistor pads.

12. The circuit board of claim 10, wherein the first pattern is formed on a first metal layer and the second pattern is formed on a different metal layer.

13. The circuit board of claim 12, wherein the first pattern is substantially symmetrical about an axis in a plane of the first metal layer.

14. The circuit board of claim 10, wherein the first pattern and the second pattern are substantially similar.

15. The circuit board of claim 10, wherein the first pattern comprises metal lines on a first metal layer formed in a symmetrical pattern about an axis in a plane of the first metal layer.

16. The circuit board of claim 15, wherein the second pattern comprises metal lines printed on a second metal layer in a substantially symmetrical pattern.

17. The circuit board of claim 10, wherein the second pattern of conductors is to couple the more than one negative clock signals of the differential clock signals with termination resistor pads.

18. A system comprising:
    a clock driver to drive a differential clock signal on more than one pairs of clock output pins, wherein each of the more than one pairs of clock output pins comprises a positive clock pin and a negative clock pin;

a processor to coordinate execution of instructions based upon a differential clock signal; and a circuit board to interconnect a first pair of the more than one pairs of clock output pins with the processor to transmit the differential clock signal to the processor, wherein the circuit board comprises a first pattern of conductors to electrically interconnect the positive clock pin of each of the more than one pairs; and a second pattern of conductors to electrically interconnect the negative clock pin of each of the more than one pairs via different conductor layers of the circuit board.

19. The system of claim 18, further comprising a chipset coupled with the circuit board to receive the differential clock signal from a second pair of the more than one pairs of clock output pins.

20. The system of claim 18, further comprising a first termination resistor coupled with the first pair between the first pattern and the processor.

21. The system of claim 18, wherein the circuit board comprises the first pattern and the second pattern on different conductor layers, the different conductor layers being substantially separated by a non-conductive layer.

22. The system of claim 21, wherein the first pattern is substantially symmetrical about an axis in a plane of the first pattern.

23. The system of claim 21, wherein the first pattern and the second pattern are substantially similar.

24. The system of claim 18, wherein the circuit board comprises the first pattern in a first metal layer, wherein the first pattern is an asymmetrical pattern about an axis in a plane of the first metal layer.

25. A machine-accessible medium containing instructions, which when executed by a machine, cause the machine to perform operations, the operations comprising:

forming a first pattern of conductors to couple more than one positive clock pins for differential clock signals produced by a clock driver with termination resistor pads, the first pattern electrically interconnecting the more than one positive clock pins at a positive clock gang point; and forming a second pattern of conductors to couple more than one negative clock pins for the differential clock signals produced by the clock driver with the termination resistor pads, the second pattern electrically interconnecting the more than one negative clock pins at a negative clock gang point, wherein forming the first pattern comprises forming the first pattern on a metallization layer, which is different from the layer upon which the second pattern is formed.

26. The machine-accessible medium of claim 25, forming the first pattern comprises forming the first pattern to be substantially similar to the second pattern.

27. The machine-accessible medium of claim 25, wherein forming the first pattern comprises forming the first pattern to be substantially symmetrical about an axis in a plane upon which the first pattern is formed.

28. The machine-accessible medium of claim 25, wherein forming the first pattern comprises forming the first pattern to be substantially asymmetrical about an axis in a plane upon which the first pattern is formed.

* * * * *

UNITED STATES PATENT AND TRADEMARK OFFICE
CERTIFICATE OF CORRECTION

| | | |
|---|---|---|
| PATENT NO. | : 7,346,880 B2 | Page 1 of 1 |
| APPLICATION NO. | : 11/171576 | |
| DATED | : March 18, 2008 | |
| INVENTOR(S) | : Huang et al. | |

It is certified that error appears in the above-identified patent and that said Letters Patent is hereby corrected as shown below:

On the face page, in field (56), under "Other Publications", in column 2, line 1, delete "Optiizing" and insert -- Optimizing --, therefor.

Signed and Sealed this

First Day of July, 2008

JON W. DUDAS
*Director of the United States Patent and Trademark Office*